US012293911B2

(12) United States Patent
Byun et al.

(10) Patent No.: US 12,293,911 B2
(45) Date of Patent: *May 6, 2025

(54) STRUCTURE INCLUDING SiOCN LAYER AND METHOD OF FORMING SAME

(71) Applicant: ASM IP Holding B.V., Almere (NL)

(72) Inventors: YoungChol Byun, Tempe, AZ (US); Bed Prasad Sharma, Gilbert, AZ (US); Shankar Swaminathan, Phoenix, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/225,366

(22) Filed: Jul. 24, 2023

(65) Prior Publication Data

US 2023/0369040 A1  Nov. 16, 2023

Related U.S. Application Data

(63) Continuation of application No. 16/802,920, filed on Feb. 27, 2020, now Pat. No. 11,742,198.

(60) Provisional application No. 62/815,841, filed on Mar. 8, 2019.

(51) Int. Cl.
*C23C 16/455* (2006.01)
*C23C 16/36* (2006.01)
*H01L 21/02* (2006.01)
*H01L 21/768* (2006.01)

(52) U.S. Cl.
CPC ........ *H01L 21/02126* (2013.01); *C23C 16/36* (2013.01); *C23C 16/45553* (2013.01); *H01L 21/02274* (2013.01); *H01L 21/0228* (2013.01); *H01L 21/76829* (2013.01)

(58) Field of Classification Search
CPC ......... H01L 21/02126; C23C 16/45553; C23C 16/36
See application file for complete search history.

(56) References Cited

U.S. PATENT DOCUMENTS

| | | |
|---|---|---|
| 9,425,038 B2 | 8/2016 | Shimizu |
| 10,600,637 B2 | 3/2020 | Suzuki et al. |
| 11,742,198 B2 * | 8/2023 | Byun ................ H01L 21/02126 438/758 |
| 2005/0080286 A1 | 4/2005 | Wang et al. |
| 2017/0117140 A1 * | 4/2017 | Tak .................... C23C 16/45536 |
| 2017/0140924 A1 | 5/2017 | Suzuki et al. |
| 2017/0323782 A1 * | 11/2017 | Suzuki ................. C23C 16/325 |

* cited by examiner

*Primary Examiner* — Elizabeth A Burkhart
(74) *Attorney, Agent, or Firm* — Snell & Wilmer L.L.P.

(57) ABSTRACT

A method for forming a layer comprising SiOCN on a substrate is disclosed. An exemplary method includes thermally depositing the layer comprising SiOCN on a surface of the substrate. The layer comprising SiOCN can be used for various applications, including spacers, etch stop layers, and etch resistant layers.

3 Claims, 2 Drawing Sheets

STRUCTURE INCLUDING SiOCN LAYER AND METHOD OF FORMING SAME

CROSS-REFERENCE TO RELATED APPLICATIONS

This application is a continuation of, and claims priority to and the benefit of, U.S. patent application Ser. No. 16/802,920, filed Feb. 27, 2020 and entitled "STRUCTURE INCLUDING SiOCN LAYER AND METHOD OF FORMING SAME," which is a nonprovisional of, and claims priority to and the benefit of, U.S. Provisional Patent Application Ser. No. 62/815,841, filed Mar. 8, 2019 and entitled "STRUCTURE INCLUDING SiOCN LAYER AND METHOD OF FORMING SAME," all of which are hereby incorporated by reference.

FIELD OF INVENTION

The present disclosure generally relates to methods of forming thin films and to structures including the thin films. More particularly, the disclosure relates methods of forming structures that include a layer comprising silicon, oxygen, carbon, and nitrogen, and to structures including such layers.

BACKGROUND OF THE DISCLOSURE

Silicon nitride films are used for a wide variety of applications. For example, such films can be used as insulating layers, as etch stop layers, and for use in the formation of spacers in the formation of electronic devices.

For several applications, it may be desirable for the silicon nitride material to be relatively resistant to wet etching processes, such as wet etching using hydrofluoric acid and/or hot phosphoric acid. Low pressure chemical vapor deposition (LPCVD) techniques can be used to deposit silicon nitride films with relatively low wet etch rates—for example, wet etch rates that are about two to about ten times lower than the etch rate of silicon oxide in the same etchant. However, such films typically require relatively high temperatures for deposition, and the high temperatures may not be suitable for some applications. Plasma-enhanced chemical vapor deposition (PECVD) techniques have also been used to deposit silicon nitride films; however, films formed using PECVD generally exhibit relatively high wet etch rates.

Unfortunately, the wet etch rates exhibited by and/or high deposition temperatures used to deposit various silicon nitride films may not be suitable for some applications. Accordingly, improved methods for forming structures are desired.

SUMMARY OF THE DISCLOSURE

Various embodiments of the present disclosure relate to methods of forming structures, such as structures suitable for use in the manufacturing of electronic devices, and to structures formed using the methods. While the ways in which various embodiments of the present disclosure address drawbacks of prior methods and structures are discussed in more detail below, in general, various embodiments of the disclosure provide improved structures that include a layer comprising SiOCN, which can be used to obtain desired etch-resistant properties, and to methods of forming such structures.

In accordance with at least one embodiment of the disclosure, a method of forming a structure includes providing a substrate within a reaction chamber and using a thermal cyclic deposition process, depositing a layer comprising SiOCN on the surface of the substrate. The SiOCN layer can be used to provide desired wet etch resistance—e.g., during a spacer formation process and/or during oxide etching of high aspect ratio features. In accordance with various aspects, the step of depositing includes atomic layer deposition (ALD). In accordance with further aspects, the step of depositing can be performed at a relatively low temperature, such as about 300° C. and about 600° C. A pressure within the reaction chamber can be between about 0.5 Torr and about 50 Torr. A carbon content of the layer comprising SiOCN comprises about 5% to about 60% carbon. Unless otherwise noted, all references to percentages represent atomic percentages.

In accordance with further exemplary embodiments of the disclosure, a structure includes a layer comprising SiOCN. The structure can include a spacer formed using a layer including SiOCN. Additionally or alternatively, the structure can include an etch stop layer that is formed from a layer including SiOCN. The structures can be formed using, for example, a method as described herein.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
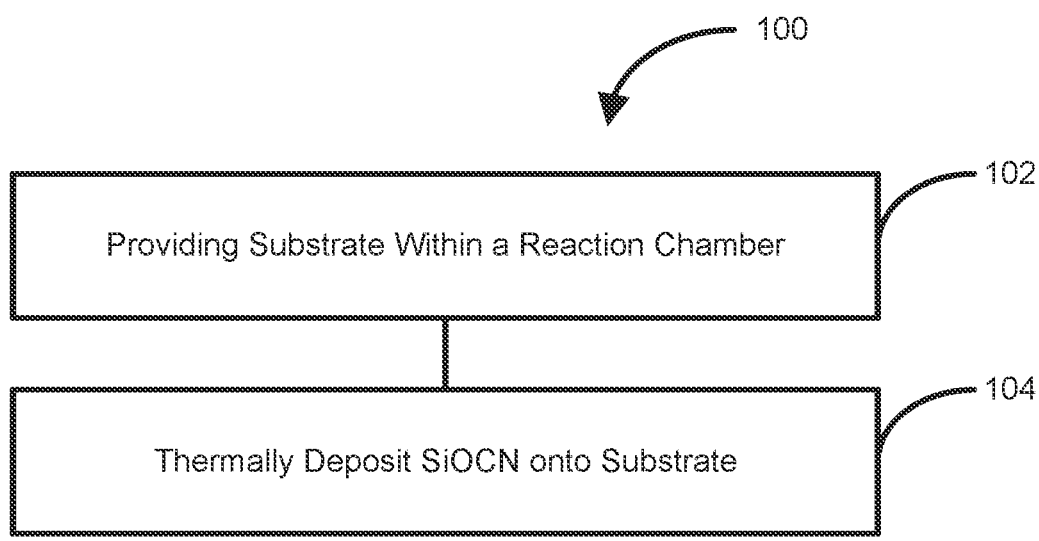
FIG. 1 illustrates a method of forming a structure in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

As used herein, the term "substrate" may refer to any underlying material or materials that may be used to form, or upon which, a device, a circuit, or a film may be formed. A substrate can include a bulk material, such as silicon (e.g., single-crystal silicon) and can include one or more layers overlying the bulk material. Further, the substrate can include various topologies, such as recesses, lines, and the like formed within or on at least a portion of a layer of the substrate.

As used herein, the term "cyclical deposition" may refer to the sequential introduction of precursors/reactants (unless otherwise noted, precursor and reactant can be used interchangeably) into a reaction chamber to deposit a layer over a substrate and includes processing techniques such as atomic layer deposition and cyclical chemical vapor deposition.

As used herein, the term "atomic layer deposition" (ALD) may refer to a vapor deposition process in which deposition cycles, typically a plurality of consecutive deposition cycles, are conducted in a process chamber. Generally, during each cycle, a precursor is chemisorbed on a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Further, purging steps can also be utilized during each cycle to remove excess precursor from the process chamber and/or remove excess reactant and/or reaction byproducts from the process chamber. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es) and purge (e.g., inert carrier) gas(es).

As used herein, the term "cyclical chemical vapor deposition" may refer to any process wherein a substrate is sequentially exposed to two or more volatile precursors, which react and/or decompose on a substrate to produce a desired deposition.

Exemplary embodiments of the disclosure relate to structures that include a layer comprising SiOCN and to methods of forming such structures. As used herein, unless stated otherwise, SiOCN is not intended to limit, restrict, or define the bonding or chemical state, for example, the oxidation state of any of Si, O, C, N and/or any other element in the film. Further, in some embodiments, SiOCN thin films may comprise one or more elements in addition to Si, O, C, and N, such as S. In some embodiments, the SiOCN films may comprise Si—C bonds and/or Si—O bonds. In some embodiments, the SiOCN films may comprise Si—C bonds and Si—O bonds. In some embodiments, the SiOCN films may comprise Si—S bonds in addition to Si—C and/or Si—O bonds. In some embodiments, the SiOCN films may comprise more Si—O bonds than Si—C bonds, for example, a ratio of Si—O bonds to Si—C bonds may be from about 1:1 to about 10:1. In some embodiments, the SiOCN films may comprise from about or greater than 0% to about 60% carbon on an atomic basis. In some embodiments, the SiOCN films may comprise from about 0.1% to about 50%, from about 0.5% to about 40%, from about 1% to about 30%, or from about 5% to about 20% carbon on an atomic basis. In some embodiments, the SiOCN films may comprise from about or greater than 0% to about 70% oxygen on an atomic basis. In some embodiments, the SiOCN films may comprise from about 10% to about 70%, from about 15% to about 50%, or from about 20% to about 40% oxygen on an atomic basis. In some embodiments, the SiOCN films may comprise about or greater than 0% to about 50% silicon on an atomic basis. In some embodiments, the SiOCN films may comprise from about 10% to about 50%, from about 15% to about 40%, or from about 20% to about 35% silicon on an atomic basis. In some embodiments, the SiOCN films may comprise from about 0.1% to about 40%, from about 0.5% to about 30%, from about 1% to about 30%, or from about 5% to about 20% hydrogen on an atomic basis. In some other embodiments, the SiOCN films may comprise from about or greater than 0% to about 30%, from about 2% to about 25%, or from about 5% to about 20% nitrogen on an atomic basis (at %). In some cases, as described in more detail below, the layer comprising SiOCN can be deposited conformally over features on a substrate.

A dielectric constant of the film comprising SiOCN can range from about 2.0 to about 4.5. By way of particular example, the dielectric constant can be between about 2.5 and about 3.7.

Turning now to the figures, FIG. 1 illustrates a method 100 of forming a structure in accordance with at least one embodiment of the disclosure. Method 100 includes the steps of providing a substrate within a reaction chamber (step 102) and using a thermal cyclic deposition process, depositing a layer comprising SiOCN on the surface of the substrate (step 104).

During step 102, a substrate is provided into a reaction chamber of a reactor. In accordance with examples of the disclosure, the reaction chamber can form part of an atomic layer deposition (ALD) reactor. Exemplary single wafer reactors, suitable for use with method 100, include reactors designed specifically to perform ALD processes, which are commercially available from ASM International NV (Almere, The Netherlands). Exemplary suitable batch ALD reactors are also commercially available from ASM International NV. Various steps of method 100 can be performed within a single reaction chamber or can be performed in multiple reaction chambers, such as reaction chambers of a cluster tool. Optionally, a reactor including the reaction chamber can be provided with a heater to activate the reactions by elevating the temperature of one or more of the substrate and/or the reactants/precursors.

During step 102, the substrate can be brought to a desired temperature and pressure for deposition during step 104. By way of examples, a temperature (e.g., of a substrate or a substrate support) within a reaction chamber can be between about 300° C. and about 600° C. or about 350° C. and about 550° C. A pressure within the reaction chamber can be about 0.5 to about 100 or about 2 to about 50 Torr.

During step 104, the layer comprising SiOCN is deposited on the substrate. Exemplary techniques for depositing SiOCN on the substrate surface include a cyclical deposition process, such as an ALD process.

One ALD or cyclic cycle may comprise exposing the substrate to a first reactant (also referred to herein as a precursor), removing any unreacted first reactant and reaction byproducts from the reaction space and exposing the substrate to a second reactant, followed by a second removal step. The first reactant may include a silicon and/or carbon source. Exemplary silicon and/or carbon source materials include one or more of silanes; particular examples include tetramethyl bis(2,2-dimethylhydrazino)disilane and 2,3-Dimethyl-2,3-DI(2,2-Dimethylhydrazino)-2,3-disilabutane.

In some embodiments, a suitable Si precursor may comprise two Si atoms connected by, or bonded to, at least one hydrocarbon group. In some embodiments, a suitable Si precursor may comprise two Si atoms connected by, or bonded to, at least one alkyl group. In some embodiments, a suitable Si precursor may comprise two Si atoms connected by, or bonded to, at least one alkoxy group. In some embodiments, a suitable Si precursor may comprise two Si atoms connected by, or bonded to, at least one silyl group. In some embodiments, a suitable Si precursor may comprise two Si atoms connected by, or bonded to, at least one silyl ether group. In some embodiments, a suitable Si precursor may comprise at least one —SH group, wherein the —SH may be bonded to an alkyl chain or a silicon atom. In some embodiments, a suitable Si precursor may comprise at least one mercapto group. In some embodiments, a suitable Si precursor may comprise at least one —R—SH structure, wherein R may be a $C_1$-$C_5$ alkyl group. In some embodiments, a suitable Si precursor may comprise at least one —SH group on an alkyl chain and one or more alkoxy groups bonded to a silicon atom.

In some embodiments, a suitable Si precursor may comprise at least one Si atom attached or bonded to one or more alkoxy groups. In some embodiments, a suitable Si precursor may comprise at least one Si atom attached or bonded to one or more alkyl groups. In some embodiments, a suitable Si precursor may comprise at least one Si atom attached or bonded to at least an alkyl group and an alkoxy group.

In some embodiments, at least some Si precursors may comprise bridged alkoxysilanes having the following general formula:

  (1)

wherein each of $R^I$ and $R^{II}$ may be independently selected alkyl groups. In some embodiments, each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise bridged alkoxyalkylsilanes having the following general formula:

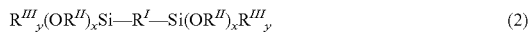  (2)

wherein each of $R^I$, $R^{II}$, and $R^{III}$ may be independently selected alkyl groups, and x+y=3. In some embodiments, each of $R^I$ and $R^{II}$ are independently selected $C_1$-$C_5$ alkyl ligands, such as methyl, ethyl, n-propyl, isopropyl, tertbutyl, or pentyl. In some embodiments, $R^{III}$ may be an independently selected $C_1$-$C_8$ alkyl ligand.

According to some embodiments, some Si precursors may comprise cyclic alkoxysilanes having the following general formula:

  (3)

Formula (3) may alternately be represented by the structural formula

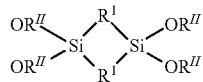

wherein each of $R^I$ and $R^{II}$ may be independently selected alkyl groups. In some embodiments, each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise cyclic alkoxyalkylsilanes having the following general formula:

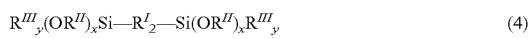  (4)

Formula (4) may alternately be represented by the structural formula

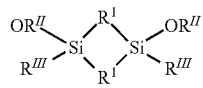

wherein each of $R^I$, $R^{II}$, and $R^{III}$ may be independently selected alkyl groups, and x+y=2. In some embodiments, each of $R^I$ and $R^{II}$ are independently selected $C_1$-$C_5$ alkyl ligands, such as methyl, ethyl, n-propyl, isopropyl, tertbutyl, or pentyl. In some embodiments, $R^{III}$ may be an independently selected $C_1$-$C_8$ alkyl ligand.

According to some embodiments, some Si precursors may comprise linear alkoxysilanes having the following general formula:

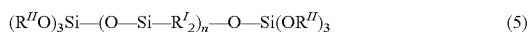  (5)

wherein $R^I$ may be an independently selected alkyl group or hydrogen, $R^{II}$ may be an independently selected alkyl group, and n=1-4. In some embodiments, each of $R^I$ and $R^{II}$ are independently selected $C_1$-$C_5$ alkyl ligands, such as methyl, ethyl, n-propyl, isopropyl, tertbutyl, or pentyl. In some embodiments, $R^I$ may be hydrogen and $R^{II}$ may be an independently selected $C_1$-$C_5$ alkyl ligand.

According to some embodiments, some Si precursors may comprise linear alkoxysilanes having the following general formula:

  (6)

wherein each of $R^I$, $R^{II}$, and $R^{III}$ may be independently selected alkyl groups, x+y=2, and n can be greater than or equal to 1. In some embodiments, $R^I$ and $R^{II}$ are independently selected $C_1$-$C_5$ alkyl ligands, such as methyl, ethyl, n-propyl, isopropyl, tertbutyl, or pentyl. In some embodiments, $R^{III}$ may be an independently selected $C_1$-$C_8$ alkyl ligand.

According to some embodiments, some Si precursors may comprise alkoxysilanes having the following general formula:

$$Si(OR^I)_4 \qquad (7)$$

wherein $R^I$ may be an independently selected alkyl group. In some embodiments, $R^I$ may be an independently selected $C_1$-$C_5$ alkyl ligand, such as methyl, ethyl, n-propyl, isopropyl, tertbutyl, or pentyl.

According to some embodiments, some Si precursors may comprise alkoxyalkylsilanes having the following general formula:

$$Si(OR^I)_{4-x}R^{II}_x \qquad (8)$$

wherein each of $R^I$ and $R^{II}$ may be independently selected alkyl groups, and x=1-3. In some embodiments, $R^I$ may be an independently selected $C_1$-$C_5$ alkyl ligand, such as methyl, ethyl, n-propyl, isopropyl, tertbutyl, or pentyl. In some embodiments, $R^{II}$ may be an independently selected $C_1$-$C_8$ alkyl ligand.

According to some embodiments, some Si precursors may comprise alkoxysilanes that do not comprise nitrogen and have the following general formula:

$$Si(OR^I)_{4-x}R^{II}_x \qquad (9)$$

wherein $R^I$ may be an independently selected alkyl group, $R^{II}$ may be any ligand comprising carbon, hydrogen, and/or oxygen that does not comprise nitrogen, and x=1-3. In some embodiments, $R^I$ may be an independently selected $C_1$-$C_5$ alkyl ligand, such as methyl, ethyl, n-propyl, isopropyl, tertbutyl, or pentyl. In some embodiments, $R^{II}$ may comprise, for example, an alkenyl, alkynyl, phenyl, carbonyl, aldehyde, ester, ether, carboxyl, peroxy, hydroperoxy, thiol, acrylate, or methacrylate ligand.

According to some embodiments, some Si precursors may have the following general formula:

$$Si(OR^I)_{4-x}R^{II}_x \qquad (10)$$

wherein x=0-3, $R^I$ may be an independently selected $C_1$-$C_7$ or $C_1$-$C_5$ alkyl ligand, and $R^{II}$ may be an independently selected ligand consisting of carbon, and/or hydrogen, and/or oxygen. For example, in some embodiments, $R^{II}$ can be an alkoxyalkyl group. In some embodiments, $R^{II}$ can be, for example, an alkenyl, alkynyl, phenyl, carbonyl, aldehyde, ester, ether, carboxyl, peroxy, or hydroperoxy group. In some embodiments, for example, $R^I$ is a methyl group, $R^{II}$ is a 3-methoxypropyl ligand, and x is 1.

According to some embodiments, some Si precursors may have the following general formula:

$$(R^IO)_{4-x}Si-(R^{II}-O-R^{III})_x \quad (11)$$

wherein x=0-3, each of $R^I$ and $R^{II}$ may be an independently selected $C_1$-$C_7$ or $C_1$-$C_5$ alkyl ligand, and $R^{III}$ may be an independently selected ligand consisting of carbon, and/or hydrogen, and/or oxygen. For example, in some embodiments $R^{III}$ can be, for example, an alkenyl, alkynyl, phenyl, carbonyl, aldehyde, ester, ether, carboxyl, peroxy, or hydroperoxy group. In some embodiments, for example, $R^I$, $R^{II}$, and $R^{III}$ can each be a group independently selected from methyl, ethyl, i-propyl, n-propyl, n-butyl, i-butyl, and t-butyl.

According to some embodiments, some Si precursors may have the following general formula:

$$Si(R^I)_{4-x-y}R^{II}_xR^{III}_y \quad (12)$$

wherein x+y=0-4, $R^I$ is an alkoxide ligand having from 1 to 5 carbon atoms, or a halide, $R^{II}$ is any ligand comprising sulfur, and $R^{III}$ consists of one of a sulfhydryl, sulfide, disulfide, sulfinyl, sulfonyl, sulfino, sulfo, thiocyanate, isothiocyanate, or carbonothioyl functionality. In some embodiments, $R^I$, $R^{II}$, and $R^{III}$ may each be independently selected. In some embodiments, $R^I$ may comprise a methoxy ligand, $R^{II}$ may comprise 3-mercaptopropyl, x=1, and y=0. That is, in some embodiments, an Si precursor may comprise $Si(OCH_3)_3C_3H_6SH$. In some embodiments, a Si precursor may comprise mercaptomethylmethyldiethoxysilane, 3-mercaptopropylmethyldimethoxysilane and/or 3-mercaptopropyltriethoxysilane.

In some embodiments, the silicon precursor does not comprise a halogen. In some embodiments, the silicon precursor does not comprise nitrogen. In some embodiments, the carbon chain may be unsaturated and contain double carbon-carbon bonds. In some other embodiments, the carbon chain may contain other atoms than carbon and hydrogen. According to some embodiments, suitable silicon precursors can include at least compounds having any of the general formulas (1) through (11). In some embodiments, the silicon precursor can comprise bis(triethoxysilyl)ethane (BTESE). In some embodiments, the silicon precursor can comprise 3-methoxypropyltrimethoxysilane (MPTMS or $Si(OCH_3)_3C_3H_6OCH_3$). In some embodiments, the silicon precursor can comprise (3-mercaptopropyl)trimethoxysilane.

The second reactant may comprise an oxygen source and/or nitrogen source, such as one or more of $N_2O$, $NH_3$, $O_2$, $H_2O$ and $H_2O_2$. Other exemplary second reactants include hydrazine ($N_2H_4$) or an alkyl-hydrazine, wherein the alkyl-hydrazine may refer to a derivative of hydrazine which may comprise an alkyl functional group and may also comprise additional functional groups. Non-limiting example embodiments of an alkyl-hydrazine may comprise at least one of tertbutylhydrazine ($C_4H_9N_2H_3$), methylhydrazine (CH3NHNH2) or dimethylhydrazine (($CH_3$)$_2$$N_2NH_2$).

In some cases, only a silicon precursor can be used to deposit a layer comprising SiOCN. For example, (tetramethyl bis(2,2-dimethylhydrazino)disilane) can be used for thermal deposition of a layer comprising SiOCN without the need of another reactant.

During the purge steps, precursors/reactants can be temporally separated by inert gases, such as argon, nitrogen, and/or helium to prevent gas-phase reactions between reactants and enable self-saturating surface reactions. In some embodiments, however, the substrate may be moved to separately contact a first vapor phase reactant and a second vapor phase reactant. Because the reactions can self-saturate, strict temperature control of the substrates and precise dosage control of the precursors is not usually required. However, the substrate temperature may be selected such that an incident gas species does not condense into monolayers or multiple layers nor thermally decompose on the surface. However, in some cases, the temperature can be selected, such that the precursor/reactant does decompose, allowing more than one monolayer to deposit on the surface at one time. Surplus chemicals and reaction byproducts, if any, are removed from the substrate surface, such as by purging the reaction space and/or by moving the substrate, before the substrate is contacted with the next reactive chemical. Undesired gaseous molecules can be effectively expelled from a reaction space with the help of an inert purging gas. A vacuum pump may be used to assist in the purging.

In some embodiments, exposing the substrate to the first reactant may comprise pulsing the first reactant over the substrate for a time period of between about 0.5 seconds and about 30 seconds, or between about 0.5 seconds and about 10 seconds, or between about 0.5 seconds and about 5 seconds. In addition, during the pulsing of the first reactant over the substrate, the flow rate of the first reactant may be less than 2000 sccm, or less than 1000 sccm, or less than 500 sccm, or less than 250 sccm or even less than 100 sccm.

In some embodiments, exposing the substrate to the second reactant may comprise pulsing the second reactant over the substrate for a time period of between about 0.5 seconds to about 30 seconds, or between about 0.5 seconds to about 10 seconds, or between about 0.5 seconds to about 5 seconds. During the pulsing of the second reactant over the substrate, the flow rate of the second reactant may be less than 4000 sccm, or less than 2000 sccm, or less than 1000 sccm, or even less than 250 sccm.

During the purge steps, excess reactant(s) and reaction byproducts, if any, may be removed from the substrate surface, for example, by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

The second reactant may react with the first reactant molecules left on the substrate surface to deposit a film comprising SiOCN. The cyclical deposition process for forming a layer comprising SiOCN may be repeated one or more times until the desired thickness of a layer comprising SiOCN is achieved. For example, the cyclical deposition process can be repeated to obtain a layer comprising SiOCN having a thickness of between approximately 0.5 nm and approximately 20 nm.

In some embodiments, two of the phases of a deposition cycle may overlap, or be combined. For example, the first reactant and the second reactant may contact the substrate simultaneously in phases that partially or completely overlap. In addition, although referred to as the first and second phases, and the first and second reactants, the order of the phases may be varied, and a cyclic (e.g., an ALD) cycle may begin with any one of the phases. That is, unless specified otherwise, the reactants can contact the substrate in any order, and the process may begin with any of the reactants.

In some embodiments, if desired, the exposed surfaces of the workpiece can be pretreated to provide reactive sites to react with the first phase of the ALD process. In some embodiments, the substrate is pretreated (e.g., with a plasma) to provide a desired surface termination. For example, a $SiI_4$ or $SiI_4/NH_3$ pre-treatment can be used on, for example a surface comprising W to reduce nucleation delay. The $SiI_4$ or $SiI_4/NH_3$ pre-treatment on W substrate can be followed by SiOCN deposition.

A gas can be provided to the reaction chamber continuously during each deposition cycle or during the entire ALD process. In some embodiments, the gas does not comprise nitrogen. In some embodiments, the gas may comprise noble gas, such as helium or argon. In some embodiments, the gas is helium. In some embodiments, the gas is argon. The flowing gas may also serve as a purge gas for the first and/or second reactant.

In some embodiments, the deposition parameters, such as the precursor flow rate, contacting time, removal time, and/or reactants themselves, may be varied in one or more deposition cycles during the cyclic/ALD process in order to obtain a film with the desired characteristics.

In some embodiments, more than one first reactant may contact the substrate surface at the same time. In some embodiments, the first reactant may comprise more than one of the first reactants described herein. In some embodiments, a first reactant is used in a first cycle and a second, different first reactant is used in a later ALD cycle. In some embodiments, multiple first reactants may be used during a single ALD phase, for example, in order to optimize certain properties of the deposited SiOCN film. In some embodiments, only one first reactant may contact the substrate during the deposition. In some embodiments, there may only be one first reactant and one second reactant or composition of second reactants in the deposition process. In some embodiments, there is no metal precursor in the deposition process. In some embodiments, the first reactant is not used as a silylating agent. In some embodiments, the deposition temperature and/or the duration of the first reactant contacting step are selected such that the first reactant does not decompose. In some embodiments, the first reactant may decompose during the contacting step. In some embodiments, the first reactant does not comprise a halogen, such as chlorine or fluorine.

Figure 2:
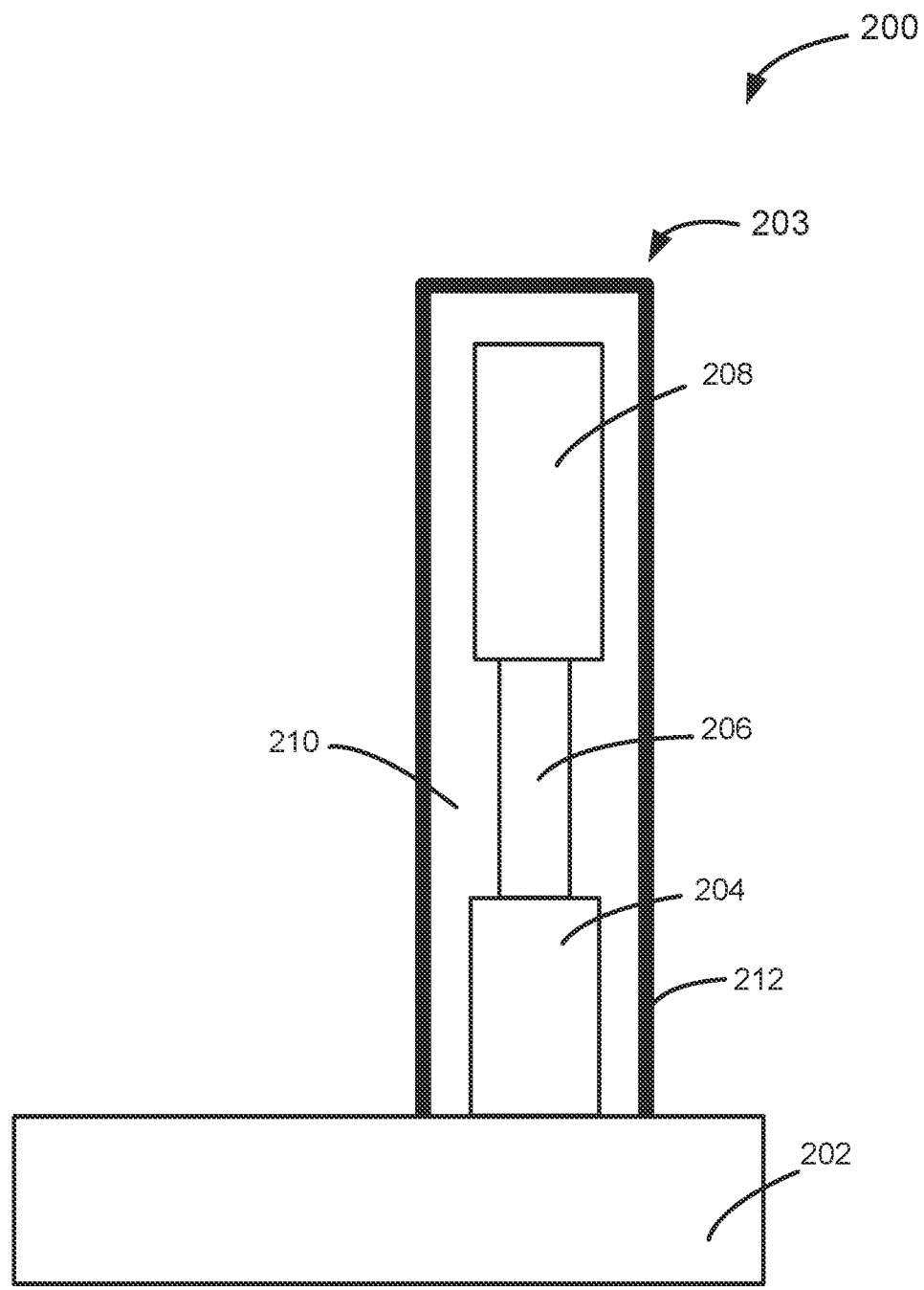
FIG. 2 illustrates a structure in accordance with at least one embodiment of the disclosure.

FIG. 2 illustrates a structure 200 in accordance with exemplary embodiments of the disclosure. Structure 200 includes a substrate 202 and a feature 203 formed thereon. Feature 203 includes a first conductive element 204, a second conductive element 206, a third element 208, a silicon nitride film 210, and a layer comprising SiOCN 212.

Substrate 202 can include any suitable material, include semiconductor material and materials typically used to form semiconductor devices. By way of example, substrate 202 can be or include silicon, other Group IV semiconductor material, a Group III-V semiconductor, and/or a Group II-VI semiconductor.

First conductive element 204 can include any suitable conductive material. By way of example, first conductive element 204 can be or include polysilicon.

Second conductive element 206 can similarly be or include any suitable conductive material. By way of example, second conductive element 206 can be or include a metal, such as tungsten or copper.

Third element 208 can be or include any suitable material. By way of example, third element 108 can be or include hard mask material, such as silicon nitride or $Al_2O_3$.

A combination of silicon nitride layer 210 and a layer comprising SiOCN can be used to form a spacer. As noted above, the combination of silicon nitride and the layer comprising SiOCN can provide desired selectivity of silicon nitride deposition as well as desired wet etch rates.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a structure, the method comprising the steps of:
using a thermal cyclic deposition process, depositing a layer comprising SiOCN on a surface of a substrate,
wherein a temperature of a susceptor within the reaction chamber during the step of depositing the layer comprising SiOCN is between about 300° C. and about 600° C., and
wherein the thermal cyclic deposition process comprises providing a silicon precursor comprising tetramethyl bis(2,2-dimethylhydrazino) disilane.

2. The method of claim 1, wherein the layer comprising SiOCN is conformally deposited onto the substrate.

3. The method of claim 1, wherein only a precursor and no reactant are used during the step of depositing a layer comprising SiOCN.

* * * * *